US012677530B2

(12) United States Patent
Yan et al.

(10) Patent No.: US 12,677,530 B2

(45) Date of Patent: Jul. 7, 2026

(54) DISPLAY PANEL AND EVAPORATION METHOD FOR DISPLAY PANEL

(71) Applicant: KunShan Go-Visionox Opto-Electronics Co., Ltd, Kunshan (CN)

(72) Inventors: Zhimin Yan, Kunshan (CN); Hao Li, Kunshan (CN); Junwei Liu, Kunshan (CN); Shengxun Su, Kunshan (CN); Yawei Liu, Kunshan (CN)

(73) Assignee: KunShan Go-Visionox Opto-Electronics Co .. Ltd, Kunshan (CN)

( * ) Notice: Subject to any disclaimer, the term of this patent is extended or adjusted under 35 U.S.C. 154(b) by 542 days.

(21) Appl. No.: 18/173,396

(22) Filed: Feb. 23, 2023

(65) Prior Publication Data

US 2023/0200103 A1 Jun. 22, 2023

Related U.S. Application Data

(63) Continuation of application No. PCT/CN2021/119824, filed on Sep. 23, 2021.

(30) Foreign Application Priority Data

Dec. 4, 2020 (CN) ........................ 202011404561.X

(51) Int. Cl.
*H10K 50/165* (2023.01)
*H10K 50/16* (2023.01)
(Continued)

(52) U.S. Cl.
CPC ......... *H10K 50/165* (2023.02); *H10K 50/166* (2023.02); *H10K 50/171* (2023.02); *H10K 59/12* (2023.02)

(58) Field of Classification Search
CPC .. H10K 50/165; H10K 50/166; H10K 50/171; H10K 50/18; H10K 71/00;
(Continued)

(56) References Cited

U.S. PATENT DOCUMENTS

2002/0086180 A1 7/2002 Seo et al.
2016/0149150 A1 5/2016 Seo et al.
(Continued)

FOREIGN PATENT DOCUMENTS

CN 1362746 A 8/2002
CN 104617223 A 5/2015
(Continued)

OTHER PUBLICATIONS

Extended Search Report issued on Feb. 2, 2024, in corresponding European Application No. 21899687.4, 12 pages.
(Continued)

*Primary Examiner* — Mohammad A Rahman

(74) *Attorney, Agent, or Firm* — Maier & Maier, PLLC

(57) ABSTRACT

A display panel and an evaporation method for the display panel. The display panel includes: a first electrode, a second electrode and a light emitting structure layer positioned between the first electrode and the second electrode. The light emitting structure layer includes: a light emitting layer; an electron transport layer arranged on a side of the light emitting layer facing away from the first electrode, and including a plurality of doped layers that are stacked; an electron injection layer positioned on a side of the electron transport layer facing away from the light emitting layer. The electron transport layer has a reference plane positioned in the middle of the electron transport layer along the thickness direction of the display panel.

17 Claims, 9 Drawing Sheets

(51) Int. Cl.
  *H10K 50/17*      (2023.01)
  *H10K 59/12*      (2023.01)
(58) Field of Classification Search
  CPC .... H10K 59/12; H10K 71/16; H10K 2101/30;
      H10K 2101/40; H10K 2101/80; H10K
      50/81; H10K 50/82; H10K 71/10; H10K
                                2102/351
  See application file for complete search history.

(56)          References Cited

U.S. PATENT DOCUMENTS

| | | |
|---|---|---|
| 2017/0098782 A1 | 4/2017 | Choi et al. |
| 2017/0194588 A1 | 7/2017 | Lei et al. |
| 2018/0006261 A1 | 1/2018 | Song et al. |
| 2019/0207122 A1* | 7/2019 | Lim .................. H10K 85/6572 |

FOREIGN PATENT DOCUMENTS

| | | |
|---|---|---|
| CN | 104638162 A | 5/2015 |
| CN | 105474422 A | 4/2016 |
| CN | 105609653 A | 5/2016 |
| CN | 105679958 A | 6/2016 |
| CN | 106784346 A | 5/2017 |
| CN | 106784355 B | 5/2017 |
| CN | 106784396 A | 5/2017 |
| CN | 107565035 | 1/2018 |
| CN | 107579158 A | 1/2018 |
| CN | 108539034 A | 9/2018 |
| CN | 109148704 A | 1/2019 |
| CN | 109390487 A | 2/2019 |
| CN | 109417132 A | 3/2019 |
| CN | 109473561 A | 3/2019 |
| CN | 109628886 A | 4/2019 |
| CN | 109920933 A | 6/2019 |
| CN | 110010777 A | 7/2019 |
| CN | 111129326 A | 5/2020 |
| CN | 111697036 A | 9/2020 |
| CN | 112670422 A | 4/2021 |
| EP | 1220340 A2 | 7/2002 |
| JP | 2002313583 A | 10/2002 |
| JP | 2003264085 A | 9/2003 |
| JP | 201921903 A | 2/2019 |
| KR | 20020055416 A | 7/2002 |
| KR | 20080067877 A | 7/2008 |
| KR | 1020080075480 A | 8/2008 |
| KR | 1020140018146 A | 2/2014 |
| KR | 1020150010603 A | 1/2015 |
| KR | 1020180003722 A | 1/2018 |
| KR | 1020190081155 A | 7/2019 |
| KR | 1020190097142 A | 8/2019 |
| KR | 1020200051658 A | 5/2020 |
| TW | I543342 B | 7/2016 |

OTHER PUBLICATIONS

International Search Report mailed Dec. 7, 2021, in International Application No. PCT/CN2021/119824, 7 pages (partial English translation provided).
Office Action issued on Jan. 6, 2022, in corresponding Chinese Application No. 202011404561.X, 28 pages.
Office Action issued on Mar. 23, 2022, in corresponding Chinese Application No. 202011404561.X, 6 pages.
Office Action issued on Mar. 19, 2024, in corresponding Japanese Application No. 2023-522908, 14 pages.
Office Action issued on Jun. 5, 2024, in corresponding Korean Application No. 10-2023-7011926, 12 pages.
Notice of Allowance issued on Sep. 18, 2025, in corresponding Korean Application No. 10-2023-7011926, 4 pages.
Office Action issued on Oct. 8, 2025, in corresponding European Application No. 21899687.4, 13 pages.
Kroger et al., "P-Type Doping of Organic Wide Band Gap Materials by Transition Metal Oxides: A Case-Study on Molybdenum Triox-ide", Organic Electronics, Elsevier B.V., May 10, 2009, vol. 10, No. 5, pp. 932-938.
Gantenbein et al., "New 4, 4'-Bis(9-Carbazoly)-Biphenyl Deriva-tives with Locked Carbazole-Biphenyl Junctions: High-Triplet State Energy Materials", Chemistry of Materials, ACS Publications, American Chemical Society, Feb. 8, 2015, vol. 27, No. 5, pp. 1772-1779.
Zhang et al., "A CBP Derivative as Bipolar Host for Performance Enhancement in Phosphorescent Organic Light-Emitting Diodes", Journal of Materials Chemistry C, RSC Publication, The Royal Society of Chemistry, Nov. 5, 2012, vol. 1, No. 4, pp. 757-764.
Park et al., "New Bipolar Green Host Materials Containing Benzimidazole-Carbazole Moiety in Phosphorescent OLEDs", Bul-letin of the Korean Chemical Society, Mar. 20, 2011, vol. 32, No. 3, pp. 841-846.
Namdas et al., "Simple Color Tuning of Phosphorescent Dendrimer Light Emitting Diodes", Applied Physical Letters, American Insti-tute of Physics, Apr. 11, 2005, vol. 86. No. 16, 161104, pp. 161104-1-161104-3.

* cited by examiner

260

263
262
261

260

265
263
262
261
264

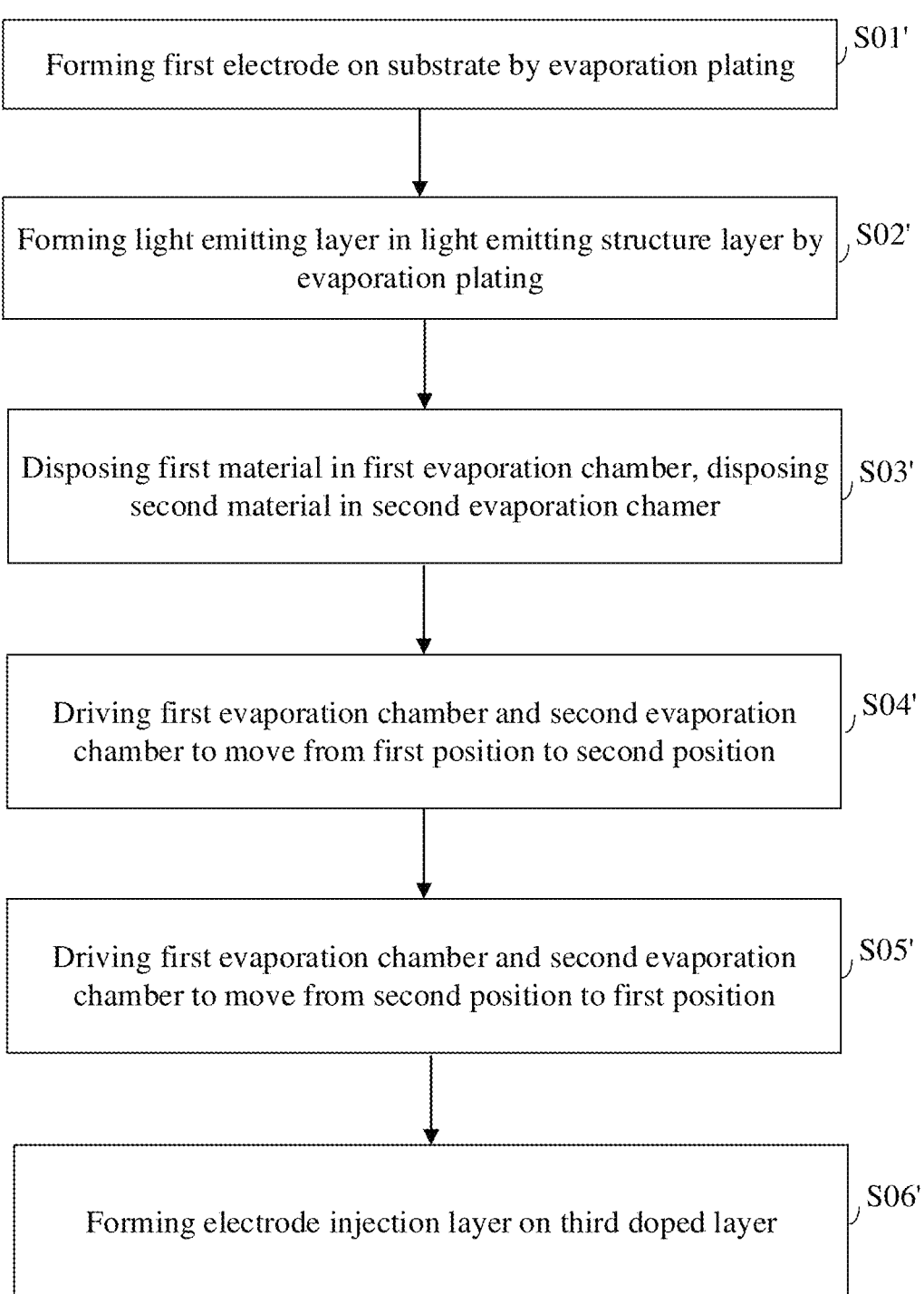

Forming first electrode on substrate by evaporation plating — S01'

Forming light emitting layer in light emitting structure layer by evaporation plating — S02'

Disposing first material in first evaporation chamber, disposing second material in second evaporation chamer — S03'

Driving first evaporation chamber and second evaporation chamber to move from first position to second position — S04'

Driving first evaporation chamber and second evaporation chamber to move from second position to first position — S05'

Forming electrode injection layer on third doped layer — S06'

Fig. 10

DISPLAY PANEL AND EVAPORATION METHOD FOR DISPLAY PANEL

CROSS-REFERENCE TO RELATED APPLICATIONS

This application is a continuation of International Application No. PCT/CN2021/119824, filed on Sep. 23, 2021, which claims priority to Chinese Patent Application No. 202011404561.X, filed on Dec. 4, 2020, both of which are hereby incorporated by reference in their entireties.

TECHNICAL FIELD

The present application relates to the technical field of displays, and in particular to a display panel and an evaporation method for display panel.

BACKGROUND

An organic light emitting diode (OLED) is an active light emitting device. Compared with conventional display manner of liquid crystal display (LCD), OLED display technology does not require backlight and has the characteristics of self-illumination. OLED employs a thin film layer of organic material and a glass substrate. When a current passes through the organic material, the organic material emits light. Therefore, an OLED display panel can significantly save power, be made lighter and thinner, withstand a wider range of temperature variation than a LCD display panel, and have a larger viewing angle. OLED display panel is expected to become the next generation of flat-panel display technology after LCD, and is one of the most concerned technologies in flat-panel display technology.

Power consumption is an important performance indicator of an OLED display panel. Power consumption is equal to the product of voltage and current. For an OLED display panel, reducing voltage under specific brightness of the OLED can effectively reduce the screen power consumption. Doping electron transmission material layer is a common approach for voltage reduction. For current mass production devices, a doping proportion of the dopant to the doped body is not changed with the change of the film thickness, so that this approach cannot reduce the voltage to the minimum.

SUMMARY

Embodiments of the present application provide a display panel and an evaporation method for display panel, aiming to reduce power consumption of the display panel.

An embodiment of a first aspect of the present application provides a display panel comprising a first electrode, a second electrode and a light emitting structure layer positioned between the first electrode and the second electrode, wherein the light emitting structure layer includes: a light emitting layer; an electron transport layer arranged on a side of the light emitting layer facing away from the first electrode; an electron injection layer positioned on a side of the electron transport layer facing away from the light emitting layer, wherein the electron transport layer includes a plurality of doped layers that are stacked, and the electron transport layer includes a reference plane positioned in the middle of the electron transport layer along a thickness direction of the display panel, an energy level of each of ones of the plurality of doped layers positioned on a side of the reference plane facing the light emitting layer is directly proportional to a distance between the doped layer and the light emitting layer, and an energy level of each of ones of the plurality of doped layers positioned on a side of the reference plane facing the electron injection layer is directly proportional to a distance between the doped layer and the electron injection layer.

An embodiment of a second aspect of the present application provides an evaporation method for display panel comprising:

disposing a substrate to be evaporated on a bearing platform;

disposing a first material in a first evaporation chamber, and disposing a second material in a second evaporation chamber, the first evaporation chamber and the second evaporation chamber being arranged along a second direction, the first evaporation chamber and the second evaporation chamber being spaced from the bearing platform along a first direction, a first opening of the first evaporation chamber and a second opening of the second evaporation chamber both facing the substrate to be evaporated, and an energy level of the first material being greater than an energy level of the second material;

driving the first evaporation chamber and the second evaporation chamber to move from a first position to a second position along the second direction, wherein the substrate to be evaporated has a preset center along the second direction, at the first position, a first angle between a line connecting the first opening to the preset center and an imaginary connecting line extending from the preset center along the first direction and perpendicular to the substrate to be evaporated is greater than a second angle between a line connecting the second opening to the preset center and the imaginary connecting line, and at the second position, the first angle is smaller than the second angle.

An embodiment of a third aspect of the present application provides an evaporation method for display panel comprising:

disposing a substrate to be evaporated on a bearing platform;

disposing a first material in a first evaporation chamber, and disposing a second material in a second evaporation chamber, the first evaporation chamber and the second evaporation chamber being spaced from the bearing platform along a first direction, a first opening of the first evaporation chamber and a second opening of the second evaporation chamber both facing the substrate to be evaporated, and an energy level of the first material being greater than an energy level of the second material;

driving the first evaporation chamber and the second evaporation chamber to move from a third position to a fourth position along a second direction, wherein a first evaporation rate of the first evaporation chamber is different than a second evaporation rate of the second evaporation chamber, a first doped layer and a second doped layer are sequentially formed on the substrate to be evaporated through evaporation, a doping proportion of the first material in the first doped layer is less than a doping proportion of the second material in the first doped layer, a doping proportion of the first material in the second doped layer is greater than a doping proportion of the second material in the second doped layer, and an energy level of the first doped layer is less than an energy level of the second doped layer.

In a display panel of an embodiment of the present application, the display panel includes a first electrode, a second electrode and a light emitting structure layer positioned between the first electrode and the second electrode. The light emitting structure layer is enabled to emit light through functions of the first electrode and the second electrode. The light emitting structure layer includes a light emitting layer, an electron transport layer and an electron injection layer. The electron transport layer includes a plurality of doped layers. Along the direction from the electron transport layer towards the light emitting layer, an energy level of a doped layer is directly proportional to the distance from the doped layer to the light emitting layer, that is, the closer to the light emitting layer, the lower the energy level of the doped layer is. The injection barrier for electrons injected from the electron transport layer into the light emitting layer can be lowered, and the voltage increase caused by electron transport can be reduced, thereby reducing the voltage required for light emission of the display panel. Along the direction from the electron transport layer towards the electron injection layer, an energy level of a doped layer is directly proportional to the distance from the doped layer to the electron injection layer, that is, the closer to the electron injection layer, the lower the energy level of the doped layer is. The injection barrier for electrons injected from the electron injection layer into the electron transport layer can be lowered, and the voltage increase caused by electron transport can be reduced, thereby reducing the voltage required for light emission of the display panel. Therefore, the implementation of the present application can reduce the power consumption of a display panel.

BRIEF DESCRIPTION OF THE DRAWINGS

FIG. 10 is a flowchart of an evaporation method for display panel provided by another embodiment of the second aspect of the present application;

DETAILED DESCRIPTION

For better understanding of the present application, a display panel and an evaporation method for display panel according to embodiments of the present application will be described in detail with reference to FIG. 1 to FIG. 13.

Figure 1:
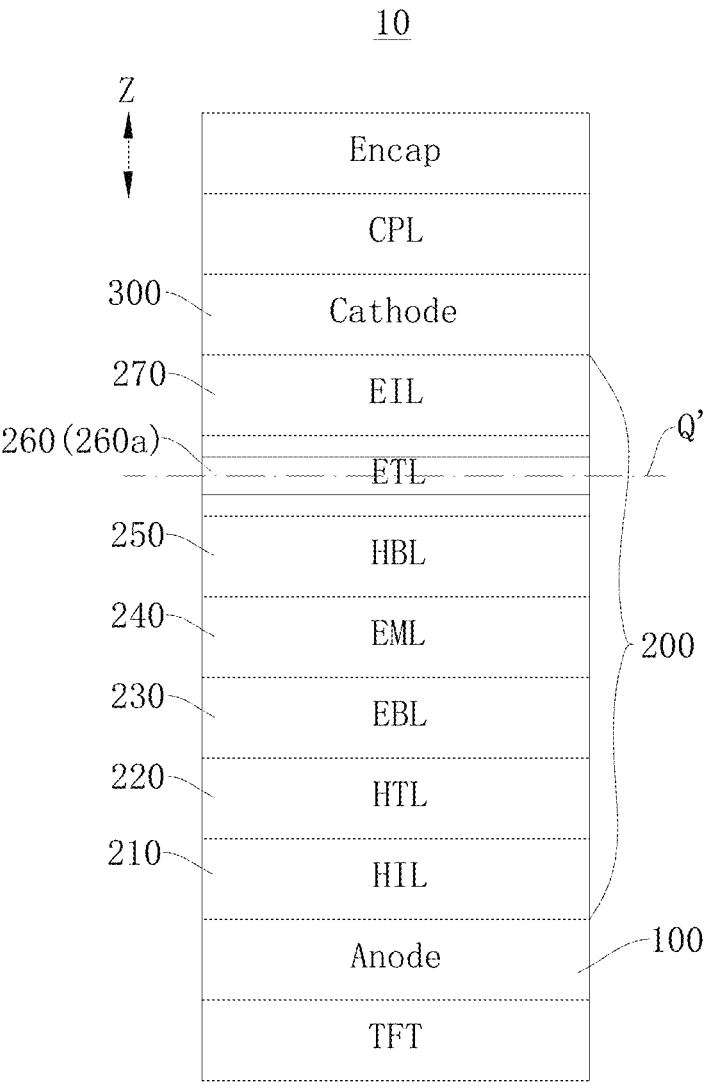
FIG. 1 is a partial cross-sectional diagram of a display panel provided by an embodiment of a first aspect of the present application.

As shown in FIG. 1, an embodiment of a first aspect of the present application provides a display panel 10. The display panel 10 includes a first electrode 100, a second electrode 300 and a light emitting structure layer 200 positioned between the first electrode 100 and the second electrode 300. The light emitting structure layer 200 includes: a light emitting layer 240; an electron transport layer 260 arranged on a side of the light emitting layer 240 facing away from the first electrode 100; and an electron injection layer 270 arranged on a side of the electron transport layer 260 facing away from the light emitting layer 240. The electron transport layer 260 includes a plurality of doped layers 260a that are stacked. The electron transport layer 260 includes a reference plane Q'. The reference plane Q' is positioned in the middle of the electron transport layer 260 along a thickness direction of the display panel 10 (Z direction in FIG. 1). An energy level of each of ones of the plurality of doped layers 260a positioned on a side of the reference plane Q' facing the light emitting layer 240 is directly proportional to a distance between the doped layer and the light emitting layer 240, and an energy level of each of ones of the plurality of doped layers 260a positioned on a side of the reference plane Q' facing the electron injection layer 270 is directly proportional to a distance between the doped layer and the electron injection layer 270.

The position of the reference surface Q' is shown with dotted lines in FIG. 1. The dotted lines do not constitute structural limitations of the display panel 10 provided by an embodiment of the first aspect of the present application. The reference plane Q' is also not a specific structure of the electron transport layer 260. In order to describe the emphasis of the present application more clearly, the energy levels of the doped layers 260 at different positions are described with reference to the reference plane Q' as a reference.

The energy level referred to herein is the lowest unoccupied molecular orbital (LUMO).

In the display panel 10 of an embodiment of the present application, the light emitting structure layer 200 is enabled to emit light through function of the first electrode 100 and the second electrode 300. The electron transport layer 260 includes N doped layers 260a.

In the present application, along the direction from the electron transport layer 260 towards the light emitting layer 240, the energy level of the doped layer 260a is directly proportional to the distance from the doped layer 260a itself to the light emitting layer 240. That is, the closer to the light emitting layer 240, the lower the energy level of the doped layer 260a is, which can reduce the injection barrier for electrons injected from the electron transport layer 260 into the light emitting layer 240, reduce the voltage increase caused by electron transport, and thus reduce the voltage required for light emission of the display panel 10.

Along the direction from the electron transport layer 260 towards the electron injection layer 270, the energy level of the doped layer 260a is directly proportional to the distance from the doped layer 260a itself to the electron injection layer 270. That is, the closer to the electron injection layer 270, the lower the energy level of the doped layer 260a is. The injection barrier for electrons injected from the electron injection layer 270 into the electron transport layer 260 can be lowered, the voltage increase caused by electron transport can be reduced, and thus reduce the voltage required for light emission of the display panel 10.

In summary, the display panel 10 of an embodiment of the present application can reduce the voltage required to reach target brightness, thereby reducing power consumption of the display panel 10.

The light emitting structure layer 200 may be arranged in various manners. Optionally, the light emitting structure layer 200 further includes a hole-blocking layer 250 arranged between the electron transport layer 260 and the light emitting layer 240, and a hole injection layer 210, a hole transport layer 220 and an electron blocking layer 230 arranged on a side along the direction from the first electrode 100 to the light emitting layer 240 in a stacked manner. The display panel 10 further includes, for example, a light extraction layer 400 and a package layer 500 that are arranged on the side of the second electrode 300 facing away from the light emitting structure layer 200.

The number of the doped layers 260a is not limited, and three doped layers 260a are illustrated in an embodiment of the first aspect of the present application as an example.

Figure 2:
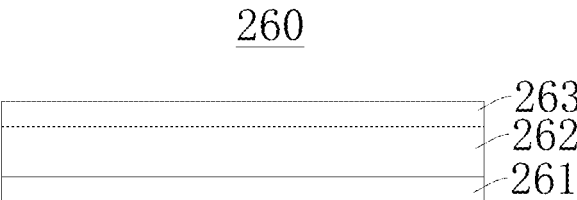
FIG. 2 is a schematic structural diagram of an electron transport layer of a display panel provided by an embodiment of the first aspect of the present application.

With reference to FIG. 2, the plurality of doped layers 260a that are stacked include a first doped layer 261, a second doped layer 262 positioned on a side of the first doped layer 261 facing away from the light emitting layer 240, and a third doped layer 263 positioned on a side of the second doped layer 262 facing away from the first doped layer 261. The energy level of the second doped layer 262 is greater than the energy levels of the first doped layer 261 and the third doped layer 263. Optionally, the reference plane Q' may be positioned in the second doped layer 262 when the second doped layer 262 is arranged close to the middle of the transport layer 260 along the thickness direction.

In these optional embodiments, the energy level of the first doped layer 261 is less than the energy level of second doped layer 262. The electron injection barrier for electrons injected from the electron transport layer 260 into the light emitting layer 240 can be lowered, and the voltage increase caused by electron transport can be reduced. The energy level of the third doped layer 263 is less than the energy level of the second doped layer 262. The electron injection barrier for electrons injected from the electron injection layer 270 into the electron transport layer 260, and the voltage increase caused by electron transport can be reduced.

In the first doped layer 261, the energy levels at different thickness positions may be the same or different. For example, the energy level of the first doped layer 261 gradually decreases along the direction from the reference plane Q' to the light emitting layer 240 to further lower the electron injection barrier.

In the third doped layer 263, the energy levels at different thickness positions may be the same or different. For example, along the direction from the reference plane Q' to the electron injection layer 270, the energy level of the third doped layer 263 gradually decreases to further lower the electron injection barrier.

In the second doped layer 262, the energy levels at different thickness positions may be the same or different. For example, the reference plane Q' is taken as a dividing line, the energy level of the second doped layer 262 gradually decreases along the direction from the reference plane Q' to the light emitting layer 240, and gradually decreases along the direction from the reference plane Q' to the electron injection layer 270 to further lower the electron injection barrier.

Optionally, the reference plane Q' is taken as a dividing line for the whole electron transport layer 260, the energy level of the electron transport layer 260 gradually decreases along the direction from the reference plane Q' to the light emitting layer 240, and the energy level of the electron transport layer 260 gradually decreases along the direction from the reference plane Q' to the electron injection layer 270.

Figure 3:
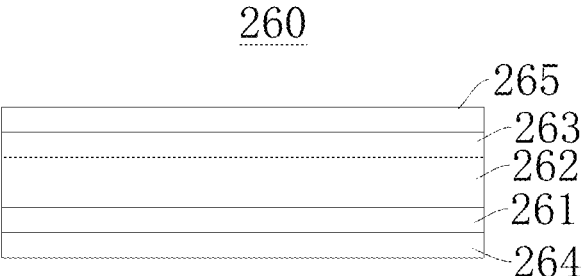
FIG. 3 is a schematic structural diagram of an electron transport layer of a display panel provided by another embodiment of the first aspect of the present application.

With reference to FIG. 3, the doped layer 260a further includes, for example, a fourth doped layer 264 on a side of the first doped layer 261 facing away from the second doped layer 262. The energy level of the fourth doped layer 264 is less than the energy level of the first doped layer 261, further lowering an electron injection barrier for electrons injected from the electron transport layer 260 into the light emitting layer 240.

The doped layer 260a further includes, for example, a fifth doped layer 265 positioned on a side of the third doped layer 263 facing away from the second doped layer 262. The energy level of the fifth doped layer 265 is less than the energy level of the third doped layer 263, further lowering an electron injection barrier for electrons injected from the electron injection layer 270 into the electron transport layer 260.

Optionally, the energy level of the doped layer 260a may be lowered in various ways. For example, the doped layer 260a having low energy level may be doped with a material having low energy level to lower the energy level of the doped layer 260a. Alternatively, the doped layer 260a with high energy level is doped with a material having high energy level to raise the energy level of the doped layer 260a.

In some optional embodiments, the material of the first doped layer 261 and the material of the third doped layer 263 include at least a second material. The second doped layer 262 is formed by doping the second material and the first material. The energy level of the first material is greater than the energy level of the second material.

In these optional embodiments, by doping the second doped layer 262 with the first material with relatively great energy level, the energy level of the second doped layer 262 can be raised so that the energy level of the first doped layer 261 is less than the energy level of second doped layer 262.

In some embodiments, an electron mobility of the first material is greater than an electron mobility of the second material. Thus, doping the second doped layer 262 with the first material can improve the electron mobility of the second doped layer 262. The electron mobility of the whole film layer can be increased, and the light emitting efficiency can be increased.

The electron mobility of the first material ranges, for example, from $9*10^{-4}$ cm$^2$/Vs to $1*10^{-5}$ cm$^2$/Vs. The electron mobility of the second material ranges from $9*10^{-6}$ cm$^2$/Vs to $1*10^{-7}$ cm$^2$/Vs.

The first material has a LUMO energy level ranging from $-1.0$ eV to $-3.0$ eV. The second material has a LUMO energy level less than or equal to 3 eV.

The first material includes at least one of TmPyPb and 3TPYMPB. The second material includes lithium 8-hydroxyquinoline, or the like.

In some embodiments, the first doped layer 261 and the third doped layer 263a are doped with the first material to increase the electron mobility of the first doped layer 261 and the electron mobility of the third doped layer 263.

Optionally, the material of the first doped layer 261 and the material of the third doped layer 263 include the second material and the first material. In the first doped layer 261, the doping proportion of the second material is greater than the doping proportion of the first material. In the second doped layer 262, the doping proportion of the first material is greater than the doping proportion of the second material. In the third doped layer 263, the doping proportion of the second material is greater than the doping proportion of the first material.

In these optional embodiments, the doping proportion of the second material is greater than the doping proportion of the first material in the first doped layer 261, and the doping proportion of the first material is greater than the doping proportion of the second material in the second doped layer 262. On the premise that the electron mobility of the first doped layer 261 is increased, the energy level of the first doped layer 261 is lowered so that the energy level of the first doped layer 261 is less than the energy level of the second doped layer 262. The doping proportion of the second material is greater than the doping proportion of the first material in the third doped layer 263. On the premise that the electron mobility of the third doped layer 263 is increased, the energy level of the third doped layer 263 is lowered so that the energy level of the third doped layer 263 is less than the energy level of the second doped layer 262.

Optionally, the doping proportion of the first material in the first doped layer 261 is less than the doping proportion of the first material in the second doped layer 262, which can further reduce the energy level of the first doped layer 261 and increase the electron mobility of the second doped layer 262.

Optionally, the doping proportion of the first material in the third doped layer 263 is less than the doping proportion of the first material in the second doped layer 262, which can further reduce the energy level of the third doped layer 263 and increase the electron mobility of the second doped layer 262.

Optionally, the doping ratio of the first material to the second material in the first doped layer 261 is less than 1. Optionally, the doping ratio of the first material to the second The doping ratio of the first material to the second material in the first doped layer 261 may be the same as or different from those in the third doped layer 263. Optionally, the doping ratio of the first material to the second material in the first doped layer 261 are the same as those in the third doped layer 263, so that the first doped layer 261 and the third doped layer 263 can be formed using the same process parameters and process steps, which can reduce the formation process difficulty of the display panel 10 and improve the formation efficiency of the display panel 10.

The thickness of the second doped layer 262 ranges from 18 nm to 30 nm;

optionally, the thickness of the first doped layer 261 ranges from 1 nm to 5 nm;

optionally, the thickness of the third doped layer 263 ranges from 1 nm to 5 nm.

Embodiment 1

In order to verify the technical solutions, a scheme is designed in which the doped layer 260a includes a first doped layer 261, a second doped layer 262 and a third doped layer 263. The first doped layer 261, the second doped layer 262 and the third doped layer 263 are all formed by being doped with the first material and the second material. The ratios of the first material to the second material in the first doped layer 261 and in the third doped layer 263 are kept at 4:6. The thicknesses of the first doped layer 261 and the third doped layer 263 are 20 Å, and the thickness of the second doped layer 262 is 240 Å. The ratio of the first material to the second material in the second doped layer 262 is made to vary from 10:2 to 2:8, and the power with the ratio of the first material to the second material in the second doped layer 262 being 4:6 is used as a basic power for comparison. Data of parameters, such as current, voltage and brightness of the display panel 10 at a light emission brightness of 733 nit are obtained as follows:

| ET1:ET2 | Voltage (V) | Current (mA) | CIE-x | CIE-y | BI(cd/A/y) | P(W) | ±P(%) |
|---|---|---|---|---|---|---|---|
| 10:0 | 6.78 | 1.216 | 0.134 | 0.0582 | 93.22 | 0.00824 | +82.0% |
| 9:1 | 4.58 | 0.998 | 0.136 | 0.0551 | 119.90 | 0.00457 | +0.9% |
| 8:2 | 4.42 | 0.994 | 0.135 | 0.0563 | 117.91 | 0.00439 | −3.0% |
| 7:3 | 4.32 | 0.991 | 0.136 | 0.0549 | 121.29 | 0.00427 | −5.5% |
| 5:5 | 4.31 | 1.017 | 0.137 | 0.054 | 119.12 | 0.00438 | −3.2% |
| 4:6 | 4.74 | 0.956 | 0.136 | 0.0551 | 125.25 | 0.00453 | 100% |
| 2:8 | | | Target brightness is not reached | | | | | material in the first doped layer 261 ranges from 1:9 to 3.5:6.5. For example, the doping ratio of the first material to the second material in the first doped layer 261 is 1:9, 2:8, 3:7, 4:6, 3.5:6.5, or the like.

Optionally, the doping ratio of the first material to the second material in the second doped layer 262 is greater than 1. Optionally, the doping ratio of the first material to the second material in the second doped layer 262 ranges from 6.5:3.5 to 9:1. For example, the doping ratio of the first material to the second material in the second doped layer 262 is 9:1, 8:2, 7:3, 6:4, 6.5:3.5, or the like.

Optionally, the doping ratio of the first material to the second material in the third doped layer 263 is less than 1. Optionally, the doping ratio of the first material to the second material in the third doped layer 263 ranges from 1:9 to 3.5:6.5. For example, the doping ratio of the first material to the second material in the third doped layer 263 is 2:8, 3:7, 4:6, 3.5:6.5, or the like.

ET1:ET2 is the ratio of the first material to the second material. The voltage is the voltage required to reach the target brightness. The current is the current at which the target brightness is reached. CIE-x and CIE-y are color coordinates of colors of light-emitting sub-pixels. BI is blue light index. P is power consumption when the target brightness is reached. ±P is a comparison value with the power consumption generated when the ratio of the first material to the second material is 4:6.

According to the above data table, it can be seen that:

1) When the ratio of the first material to the second material in the second doped layer 262 is reduced to 2:8, the light emitting voltage of the display panel 10 increases sharply and the target brightness is not reached.

2) As the proportion of the first material in the second doped layer 262 increases, the voltage of the display panel 10 decreases to some extent. At the ratio of the first material to the second material being 7:3 and 5:5, the voltage of the display panel 10 decreases the most by about 0.4V, while the decrease in efficiency is not significant. However, when the ratio of the first material to the second material in the second doped layer 262 is 10:0, the voltage of the display panel 10 is instead increased to 6.78V, and the efficiency is greatly decreased to 0.00824 W.

3) By calculating the power consumption of the display panel 10 through the product of voltage and current, the power consumption decreases when the ratio of the first material to the second material in the second doped layer 262 is between 5:5 and 8:2. The power consumption decreases most significantly when the ratio of the first material to the second material in the second doped layer 262 is 7:3, and the power consumption decreases by 5.5%.

Figure 4:
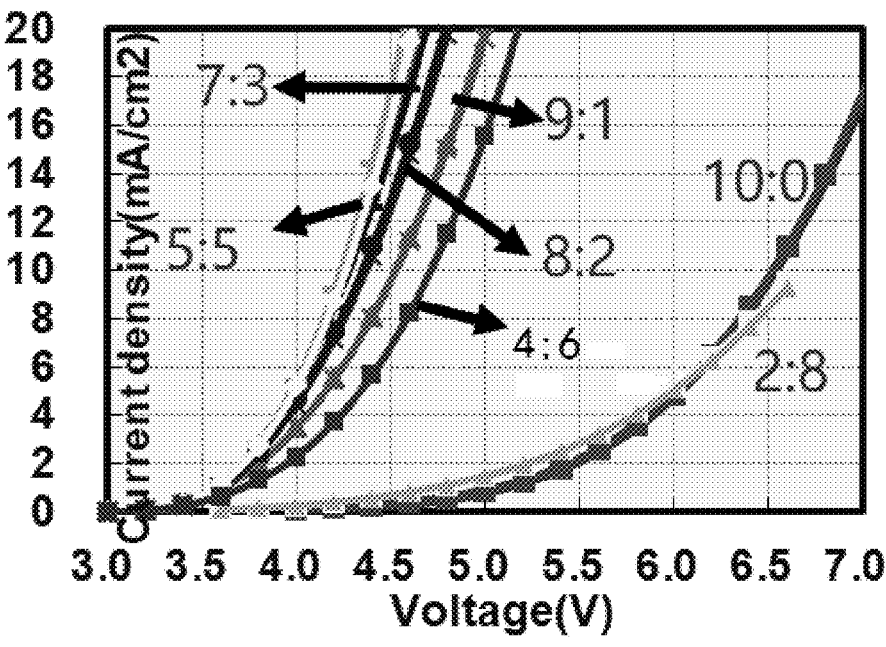
FIG. 4 is a current density-voltage graph of a display panel measured according to Embodiment 1.

As can be seen in FIG. 4, when the ratio of the first material to the second material in the second doped layer 262 is between 5:5 and 9:1, the current density is significantly greater than the current density when the ratio of the first material to the second material in the second doped layer 262 is 4:6. When the ratio of the first material to the second material in the second doped layer 262 is between 10:0 and 2:8, the current density is sharply decreased, so that the voltage is rapidly increased and even the target brightness cannot be reached.

Figure 5:
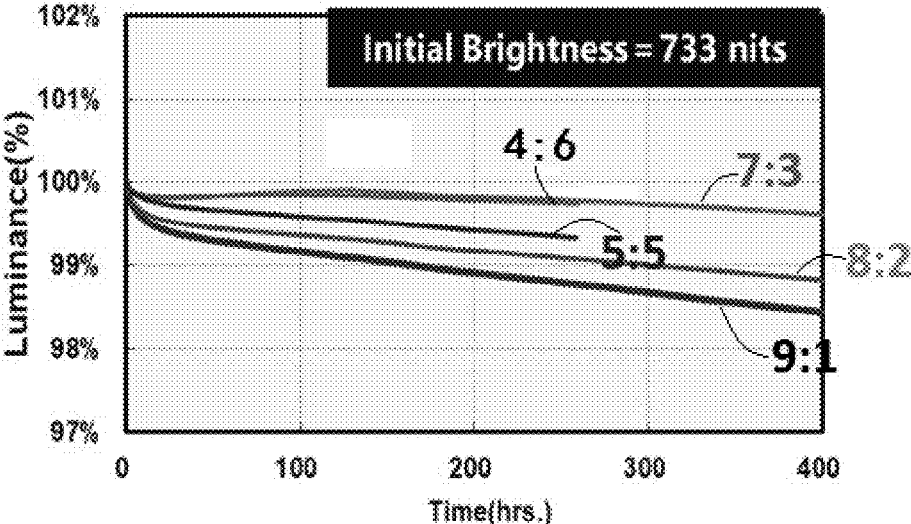
FIG. 5 is a brightness degradation graph of a display panel measured according to Embodiment 1.

With reference to FIG. 5, the brightness degradation graph of the display panel 10 according to Embodiment 1 shows that the initial brightness is 733 nits.

As can be seen from FIG. 5, the brightness degradation when the ratio of the first material to the second material in the second doped layer 262 is 7:3 is almost identical to the brightness degradation when the ratio of the first material to the second material in the second doped layer 262 is 4:6. Adjustment of the ratio of the first material to the second material in the second doped layer 262 from 4:6 to 7:3 has a very limited effect on the lifetime of the second doped layer 262. However, when the ratio of the first material to the second material in the second doped layer 262 is other ratio, the degradation rate of the second doped layer 262 increases, that is, the lifetime of the second doped layer 262 decreases.

COMPARATIVE EXAMPLE 1

Comparative experiments were carried out with the ratio of the first material to the second material in the second doped layer 262 being 7:3 and the ratios of the first material to the second material in the first doped layer 261 and the third doped layer 263 being different, and the following results are acquired:

| ET1:ET2 | Voltage (V) | Current (mA) | CIE-x | CIE-y | BI | P (mW) | ±P(%) |
|---|---|---|---|---|---|---|---|
| 7:3 + 7:3 + 7:3 | 4.05 | 1.568 | 0.139 | 0.049 | 141.32 | 6.35 | 100% |
| 2:8 + 7:3 + 2:8 | 3.93 | 1.548 | 0.140 | 0.047 | 148.75 | 6.08 | −4.3% |

The first set of data represents the test results obtained when the doping ratios of the first material to the second material in the first doped layer 261, the second doped layer 262 and the third doped layer 263 are all 7:3. The second set of data represents the test results obtained when the doping ratios of the first material to the second material in the first doped layer 261 and the third doped layer 263 are 2:8, and the doping ratio of the first material to the second material in the second doped layer 262 is 7:3.

As can be seen from the above table, when the doping ratios of the first material to the second material in the first doped layer 261 and the third doped layer 263 are both 2:8, the power consumption of the display panel 10 is relatively low.

Figure 6:
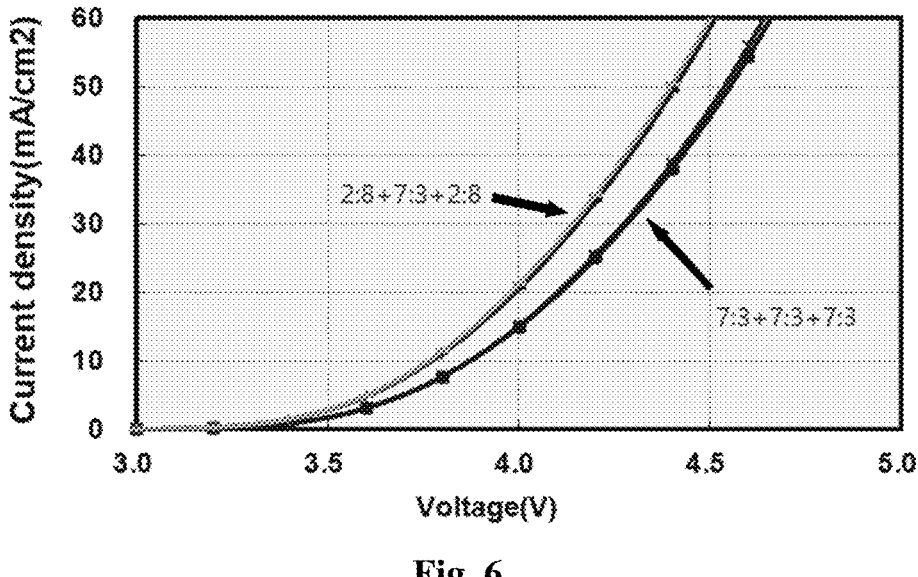
FIG. 6 is a current density-voltage graph of a display panel measured according to Comparative Example 1.

It can be seen from FIG. 6 that when the doping ratios of the first material to the second material in the first doped layer 261 and the second doped layer 262 are 2:8, the current density increases, the voltage of the display panel 10 decreases by 0.12 V at the target brightness, and it is estimated that the power consumption of the display panel 10 decreases by 4.3%.

Figure 7:
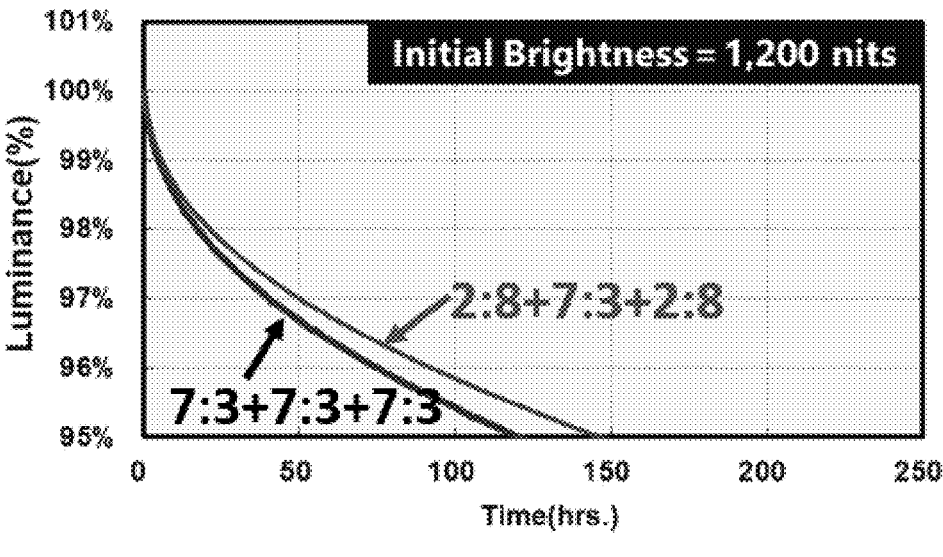
FIG. 7 is a brightness degradation graph of a display panel measured according to Comparative Example 1.
Figure 8:
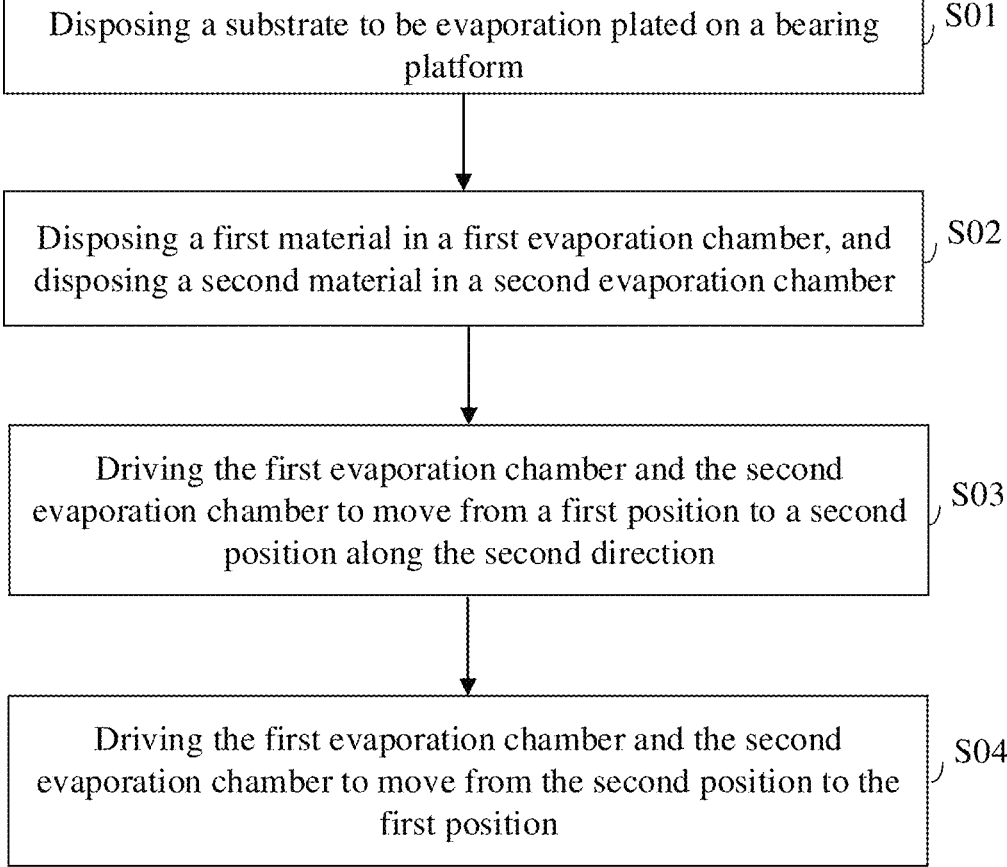
FIG. 8 is a flowchart of an evaporation method for display panel according to an embodiment of a second aspect of the present application.

Reference is made to FIG. 7, which is a schematic brightness degradation graph of a display panel 10 measured according to Comparative Example 1. The initial brightness is 733 nits.

As can be seen from the brightness degradation graph, when the doping ratios of the first material to the second material in the first doped layer 261 and the second doped layer 262 are 2:8, the device lifetime of the display panel 10 is improved to some extent. The evaporation method for the display panel 10 provided by the second aspect of the present application includes steps S01 to S03.

At step S01, a substrate to be evaporated 30 is disposed on a bearing platform.

At step S02, a first material is disposed in a first evaporation chamber 21, and a second material is disposed in a second evaporation chamber 22.

Figure 9:
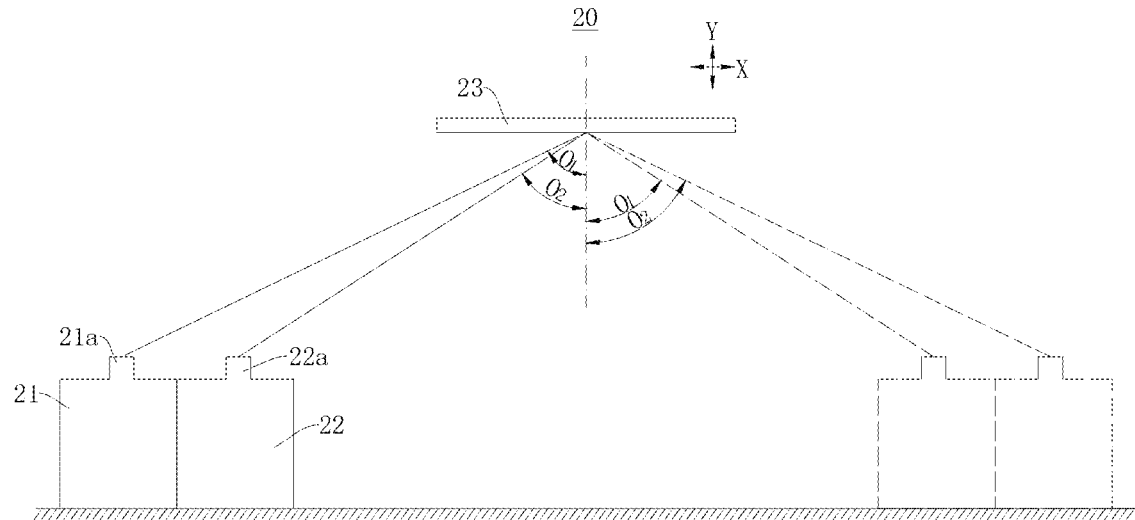
FIG. 9 is a schematic diagram showing a use state of an evaporation apparatus when evaporation is performed using the evaporation method according to the second aspect of the present application.

The first evaporation chamber 21 and the second evaporation chamber 22 are arranged along a second direction (X direction in FIG. 9), and the first evaporation chamber 21 and the second evaporation chamber 22 are spaced from the bearing platform along the first direction (Y direction in FIG. 9). The first opening 21a of the first evaporation chamber 21 and the second opening 22a of the second evaporation chamber 22 both face the substrate to be evaporated 30, and an energy level of the first material is greater than an energy level of the second material.

At step S03, the first evaporation chamber 21 and the second evaporation chamber 22 are driven to move from a first position to a second position along the second direction.

The substrate to be evaporated 30 has a preset center along a second direction. An imaginary connecting line extending from the preset center along the first direction and perpendicular to the substrate to be evaporated 30 is formed. A first angle $O_1$ is formed between a line connecting the first opening 21a to the preset center and the imaginary connecting line. A second angle $O_2$ is formed between a line connecting the second opening 22a to the preset center and a vertical direction. At the first position, the first angle $O_1$ is greater than the second angle $O_2$. At the second position, the first angle $O_1$ is smaller than the second angle $O_2$. FIG. 9 illustrates the use state when the first evaporation chamber 21 and the second evaporation chamber 22 are at the first position with solid line, and illustrates the use state when the first evaporation chamber 21 and the second evaporation chamber 22 are at the second position with dashed line.

According to the evaporation method for the display panel 10 according to an embodiment of the second aspect of the present application, first, the substrate to be evaporated 30 is disposed on the bearing platform. Then, the first material is disposed in the first evaporation chamber 21 and the second evaporation chamber 22, and since both the first opening 21a and the second opening 22a face the substrate to be evaporated 30, the substrate to be evaporated 30 can be evaporated with the first material thereon through the first opening 21a, and the substrate to be evaporated 30 can be evaporated with the second material thereon through the second opening 22a. Finally, the first evaporation chamber 21 and the second evaporation chamber 22 are driven to move from the first position to the second position.

At the first position, the first angle $O_1$ is greater than the second angle $O_2$, that is, the distance between the first opening 21a and the substrate to be evaporated 30 is greater than the distance between the second opening 22a and the substrate to be evaporated 30. Therefore, when evaporation is started at the first position, the substrate to be evaporated 30 is evaporated with greater amount of the second material thereon than the first material.

At the second position, the first angle $O_1$ is smaller than the second angle $O_2$, that is, the distance between the first opening 21a and the substrate to be evaporated 30 is smaller than the distance between the second opening 22a and the substrate to be evaporated 30. At the second position, the substrate to be evaporated 30 is evaporated with greater amount of the first material thereon than the second material.

Therefore, the substrate to be evaporated 30 which is evaporated by the evaporation method for the display panel 10 of the present application can form layer structures with the same doping materials but different doping proportions of the materials during the evaporation process.

For example, during the evaporation of the electron transport layer 260 of the display panel 10 according to an embodiment of the first aspect of the present invention using the evaporation method according to an embodiment of the second aspect of the present invention, different doped layers 260a may be formed, and the doping ratios of the first material to the second material in the different doped layers 260a may be different.

In some optional embodiments, step S03 is followed by step S04, at which the first evaporation chamber 21 and the second evaporation chamber 22 are driven to move from the second position to the first position. In these embodiments, evaporation may be continued to form layer structures with the same doping materials but different doping proportions of the materials.

Optionally, the first position and the second position are symmetrically arranged with respect to the preset center, so that the evaporated amounts and the material proportions of the first material and the second material evaporated from the first position to the second position are the same as the evaporation amounts and material proportions of the first material and the second material evaporated from the second position to the first position.

With reference to FIG. 10, an example is illustrated below in which the display panel 10 provided in FIG. 1 and FIG. 2 is formed by the evaporation method for the display panel 10 according to an embodiment of the second aspect of the present application.

At step S01', the first electrode 100 is formed on the substrate by evaporation.

At step S02', the light emitting layer 240 in the light emitting structure layer 200 is formed on the first electrode 100 by evaporation.

Optionally, layer structures such as a hole injection layer 210, a hole transport layer 220, and an electron blocking layer 230 in the light emitting structure layer 200 may be formed on the first electrode 100 by evaporation before step S02'. After step S02', a layer structure such as a hole-blocking layer 250 may be formed on the light emitting layer 240 by evaporation.

At step S03', the first material is disposed in the first evaporation chamber 21, and the second material is disposed in the second evaporation chamber 22.

At step S04', the first evaporation chamber 21 and the second evaporation chamber 22 are moved from the first position to the second position.

During the process of moving the first evaporation chamber 21 and the second evaporation chamber 22 from the first position to the second position, in the initial stage, the first angle $O_1$ is greater than the second angle $O_2$, the evaporated amount of the first material is less than the evaporated amount of the second material, and the first doped layer 261 can be formed. When the first angle $O_1$ and the second angle $O_2$ are equal, the evaporation process for the first doped layer 261 is ended. When the first angle $O_1$ is smaller than the second angle $O_2$, evaporation process for the second doped layer 262 is started.

At step S05', the first evaporation chamber 21 and the second evaporation chamber 22 are moved from the second position to the first position.

During the process of moving the first evaporation chamber 21 and the second evaporation chamber 22 from the second position to the first position, in the initial stage, the first angle $O_1$ is smaller than the second angle $O_2$, and the evaporated amount of the first material is greater than the evaporated amount of the second material, so that the second doped layer 262 can be continuously formed. When the first angle $O_1$ and the second angle $O_2$ are equal, the evaporation process for the second doped layer 262 is ended. When the first angle $O_1$ is greater than the second angle $O_1$, evaporation process for the third doped layer 263 is started. Finally, when the first evaporation chamber 21 and the second evaporation chamber 22 are moved to the first position, the evaporation process for the third doped layer 263 is completed.

At step S06', an electron injection layer 270 is formed on the third doped layer 263.

In the formation of the electron transport layer 260 by evaporation using the evaporation method provided by an embodiment of the second aspect of the present application in steps S03' to S05', the first doped layer 261, the second doped layer 262 and the third doped layer 263 may be formed by evaporation, and the doping proportion of the first material is less than the doping proportion of the second material in the first doped layer 261, so that the energy level of the first doped layer 261 is relatively low, the doping proportion of the first material is greater than the doping proportion of the second material in the second doped layer 262, the electron mobility of the second doped layer 262 is relatively high, and the energy level of the first doped layer 261 is lower than the energy level of the second doped layer 262. Similarly, the energy level of the third doped layer 263 is lower than the energy level of the second doped layer 262.

In addition, in the formation of the electron transport layer 260 by evaporation using the evaporation method provided by an embodiment of the second aspect of the present application, taking the reference plane Q' of the electron transport layer 260 along the thickness direction as a boundary, the energy level of the electron transport layer 260 gradually decreases along the direction from the reference plane Q' to the light emitting layer 240, and the energy level of the electron transport layer 260 gradually decreases along the direction from the reference plane Q' to the electron injection layer 270, so that the electron injection barrier can be further lowered and the power consumption of the display panel 10 can be reduced.

Figure 11:
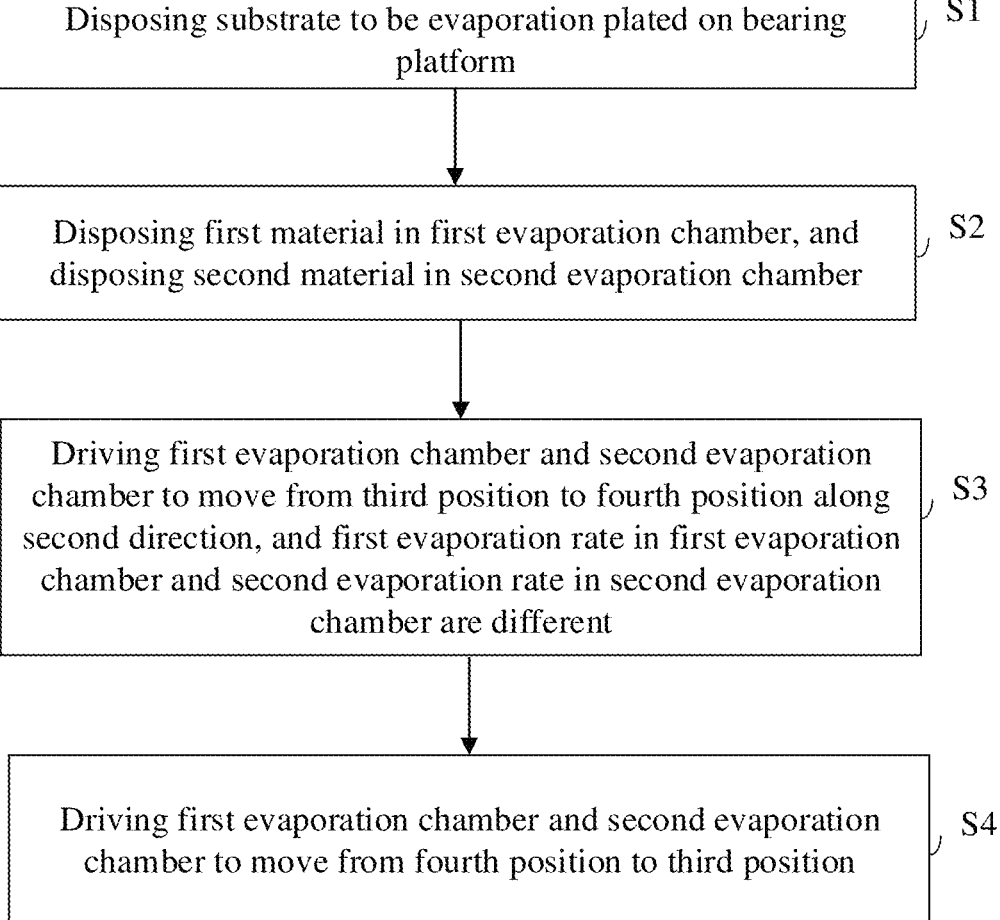
FIG. 11 is a flowchart of an evaporation method for display panel provided by an embodiment of the third aspect of the present application.

With reference to FIG. 11, a third aspect of the present application further provides an evaporation method for display panel, which includes steps S1 to S3.

At step S1, the substrate to be evaporated 30 is arranged on a bearing platform.

At step S2, the first material is disposed in the first evaporation chamber 21, and the second material is disposed in the second evaporation chamber 22.

The first evaporation chamber 21 and the second evaporation chamber 22 are spaced from the bearing platform along a first direction (Y direction in FIG. 9). The first opening 21a of the first evaporation chamber 21 and the second opening 22a of the second evaporation chamber 22 both face the substrate to be evaporated 30, and the energy level of the first material is greater than the energy level of the second material.

In the evaporation method provided by the embodiments of the present application, as shown in FIG. 9, the first evaporation chamber 21 and the second evaporation chamber 22 may be arranged along the second direction (X direction in FIG. 9). Alternatively, the first evaporation chamber 21 and the second evaporation chamber 22 may be arranged side by side. There is no requirement of the initial positions of the first evaporation chamber 21 and the second evaporation chamber 22.

At step S3, the first evaporation chamber 21 and the second evaporation chamber 22 are driven to move from the third position to the fourth position along the second direction, and the first evaporation rate of the first evaporation chamber 21 is different from the second evaporation rate of the second evaporation chamber 22.

The first evaporation rate of the first evaporation chamber 21 is the amount of the first material that is evaporated out from the first opening 21a during movement of the first evaporation chamber 21. Alternatively, the first evaporation rate of the first evaporation chamber 21 is the amount of the first material that is evaporated onto the substrate 23 to be evaporated during movement of the first evaporation chamber 21.

Similarly, the second evaporation rate of the second evaporation chamber 22 is the amount of the second material evaporated out from the first opening 22a during the movement of the second evaporation chamber 22. Alternatively, the second evaporation rate of the second evaporation chamber 22 is the amount of the second material evaporated onto the substrate 23 to be evaporated during the movement of the second evaporation chamber 22.

The first evaporation rate of the first evaporation chamber 21 is different from the second evaporation rate of the second evaporation chamber 22. The amounts of the first material and the second material evaporated onto the substrate 23 to be evaporated are different. Therefore, a first doped layer 261 and a half of a second doped layer 262 close to the first doped layer 261 can be successively evaporated and formed on the substrate 23 to be evaporated, and the doping proportion of the first material in the first doped layer 261 is less than the doping proportion of the second material, the doping proportion of the first material in the second doped layer 262 is greater than the doping proportion of the second material, and the energy level of the first doped layer 261 is less than the energy level of the second doped layer 262.

At the third position, there may be various arrangements of the relative positions of the first evaporation chamber 21 and the second evaporation chamber 22. For example, the first evaporation chamber 21 and the second evaporation chamber 22 may be disposed at the first position described above so that $O_1$ is larger than $O_2$. In other embodiments, the first evaporation chamber 21 and the second evaporation chamber 22 may be arranged side by side, that is, $O_1$ is equal to $O_2$. Alternatively, the arrangement manner of the first evaporation chamber 21 and the second evaporation chamber 22 may be opposite to the arrangement manner at the first position, that is, $O_1$ is smaller than $O_2$. At the fourth position, the sizes of $O_1$ and $O_2$ are not limited, where $O_1$ may be larger than $O_2$, $O_1$ may be equal to $O_2$, or $O_1$ may be smaller than $O_2$, as long as the first doped layer 261 and the half of the second doped layer 262 can be formed by evaporation.

In other embodiments, step S3 is followed by step S4, at which the first evaporation chamber 21 and the second evaporation chamber 22 are driven to move from the fourth position to the third position, to form the other half of the second doped layer 262 and the third doped layer 263.

In the evaporation method for the display panel 10 according to the third embodiment of the present application, two doped layers 260 with different energy levels can be formed by appropriately adjusting the evaporation rates of the first evaporation chamber 21 and the second evaporation chamber 22.

In further optional embodiments, an embodiment of the third aspect described above may be combined with an embodiment of the second aspect. For example, in the evaporation method according to an embodiment of the second aspect of the present application, by appropriately adjusting the evaporation rates of the first evaporation chamber 21 and the second evaporation chamber 22, the doped layers 260a with different proportions can be formed by evaporation. The evaporation rates of the first evaporation chamber 21 and the second evaporation chamber 22 may be the same or different, and the evaporation rates of the first evaporation chamber 21 and the second evaporation chamber 22 may be controlled independently of each other.

The first evaporation chamber 21 and the second evaporation chamber 22 are moved from the first position to the second position and from the second position to the first position for evaporation, with the ratios between their respective evaporation rates being 7:3 and 4:6.

Figure 12:
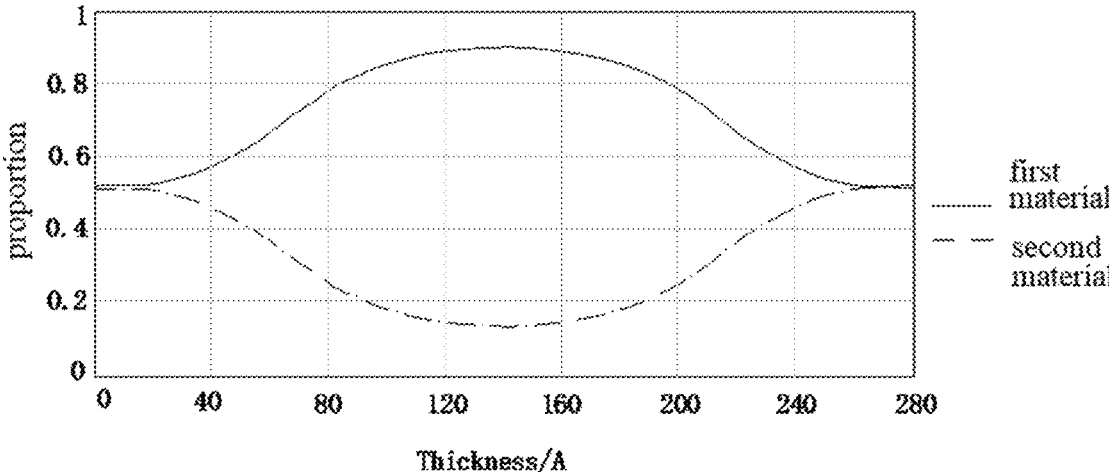
FIG. 12 is a graph of doping proportions of a first material and a second material at different thickness positions on a substrate to be evaporated measured at an evaporation rate.
Figure 13:
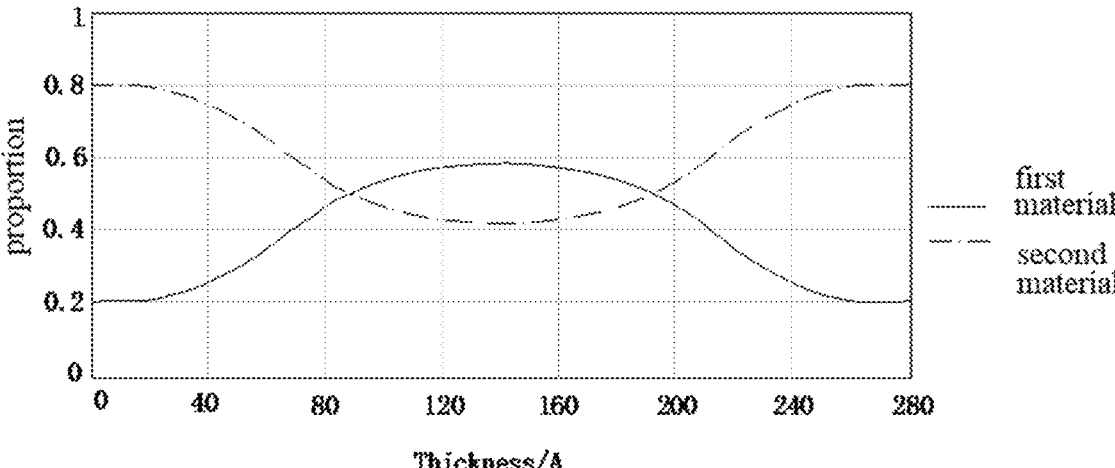
FIG. 13 is a graph of doping proportions of a first material and a second material at different thickness positions on a substrate to be evaporated measured at another evaporation rate.

With reference to FIG. 12 and FIG. 13 together, FIG. 12 illustrates a graph showing the measured doping proportions of the first material and the second material at different thickness positions on the substrate to be evaporated 30 when the ratios between the evaporation rates of the first evaporation chamber 21 and the second evaporation chamber 22 is 7:3. FIG. 13 is a graph showing the measured doping proportions of the first material and the second material at different thickness positions on the substrate to be evaporated 30, when the ratio between the evaporation rates of the first evaporation chamber 21 and the second evaporation chamber 22 is 4:6.

The abscissa in FIG. 12 and FIG. 13 indicate different thickness positions. Assuming that the thicknesses of the first doped layer 261 and the third doped layer 263 are 20 Å, and the thickness of the second doped layer 262 is 240 Å, thickness value of 0 Å-20 Å is the first doped layer 261, thickness value of 21 Å-260 Å is the second doped layer 262, and thickness value of 261 Å-280 Å is the third doped layer 263. As can be seen from FIG. 12 and FIG. 13.

1) When ratio between the evaporation rates of evaporation performed in the first evaporation chamber 21 and the second evaporation chamber 22 is 7:3, the doping ratio of the first material to the second material in the first doped layer 261 and the third doped layer 263 is about 5:5, and the doping ratio of the first material to the second material in the second doped layer 262 is about 9:1.

2) When ratio between the evaporation rates of evaporation performed in the first evaporation chamber 21 and the second evaporation chamber 22 is 4:6, the doping ratio of the first material to the second material in the first doped layer 261 and the third doped layer 263 is about 2:8, and the doping ratio of the first material to the second material in the second doped layer 262 is about 6.5:3.5.

Thus, it can be seen that the doping proportions of the first material and the second material can be adjusted by changing the evaporation rates of the first evaporation chamber 21 and the second evaporation chamber 22.

In some other embodiments, the doping proportions of the first material and the second material may also be changed by changing the spacing between the first evaporation chamber 21 and the second evaporation chamber 22 at the first location and/or the second location.

What is claimed is:

1. A display panel, comprising a first electrode, a second electrode and a light emitting structure layer positioned between the first electrode and the second electrode, wherein the light emitting structure layer comprises:
   a light emitting layer;
   an electron transport layer arranged on a side of the light emitting layer facing away from the first electrode; and
   an electron injection layer positioned on a side of the electron transport layer facing away from the light emitting layer, wherein the electron transport layer comprises a plurality of doped layers that are stacked, and the electron transport layer includes a reference plane positioned in the middle of the electron transport layer along a thickness direction of the display panel, an energy level of each doped layer of the plurality of doped layers positioned on a side of the reference plane facing the light emitting layer is directly proportional to a distance between the plurality of doped layers and the light emitting layer, and an energy level of each doped layer of the plurality of doped layers positioned on a side of the reference plane facing the electron injection layer is directly proportional to a distance between the plurality of doped layers and the electron injection layer.

2. The display panel according to claim 1, wherein the plurality of the doped layers that are stacked comprise a first doped layer, a second doped layer positioned on a side of the first doped layer facing away from the light emitting layer, and a third doped layer positioned on a side of the second doped layer facing away from the first doped layer, and an energy level of the second doped layer is greater than an energy level of the first doped layer and an energy level of the third doped layer.

3. The display panel according to claim 2, wherein the light emitting structure layer further comprises
   a hole-blocking layer, the first doped layer is located between the hole-blocking layer and the second doped layer, and the third doped layer is located between the second doped layer and the electron injection layer.

4. The display panel according to claim 2, wherein a material of the first doped layer and a material of the third doped layer comprise at least a second material, the second doped layer is formed by doping the second material and a first material, and an energy level of the first material is greater than an energy level of the second material.

5. The display panel according to claim 4, wherein an electron mobility of the first material is greater than an electron mobility of the second material.

6. The display panel according to claim 5, wherein the electron mobility of the first material ranges from 9*10−4 cm2/Vs to 1*10−5 cm2/Vs, and the electron mobility of the second material ranges from 9*10−6 cm2/Vs to 1*10−7 cm2/Vs.

7. The display panel according to claim 4, wherein the material of the first doped layer and the material of the third doped layer comprise the second material and the first material; a doping proportion of the second material in the first doped layer is greater than a doping proportion of the first material in the first doped layer, a doping proportion of the first material in the second doped layer is greater than a doping proportion of the second material in the second doped layer, and a doping proportion of the second material in the third doped layer is greater than a doping proportion of the first material in the third doped layer.

8. The display panel according to claim 7, wherein a doping ratio of the first material to the second material in the first doped layer is the same as a doping ratio of the first material to the second material in the third doped layer.

9. The display panel according to claim 7, wherein
   the doping proportion of the first material in the first doped layer is less than the doping proportion of the first material in the second doped layer; and/or
   the doping proportion of the first material in the third doped layer is less than the doping proportion of the first material in the second doped layer.

10. The display panel according to claim 9, wherein a doping ratio of the first material to the second material in the first doped layer ranges from 1:9 to 3.5:6.5, a doping ratio of the first material to the second material in the third doped layer ranges from 1:9 to 3.5:6.5, and a doping ratio of the first material to the second material in the second doped layer ranges from 6.5:3.5 to 9:1.

11. The display panel according to claim 2, wherein a thickness of the second doped layer ranges from 18 nm to 30 nm.

12. The display panel according to claim 2, wherein a thickness of the first doped layer ranges from 1 nm to 5 nm.

13. The display panel according to claim 2, wherein a thickness of the third doped layer ranges from 1 nm to 5 nm.

14. The display panel according to claim 4, wherein an energy level of lowest unoccupied molecular orbital of the first material ranges from −1.0 eV to −3.0 eV, and an energy level of lowest unoccupied molecular orbital of the second material is less than or equal to 3 eV.

15. An evaporation method for the display panel according to claim 1, comprising:
   disposing a substrate to be evaporated on a bearing platform;
   disposing a first material in a first evaporation chamber, and
   disposing a second material in a second evaporation chamber, the first evaporation chamber and the second evaporation chamber being arranged along a second direction, the first evaporation chamber and the second evaporation chamber being spaced from the bearing platform along a first direction, a first opening of the first evaporation chamber and a second opening of the second evaporation chamber both facing the substrate to be evaporated, and an energy level of the first material being greater than an energy level of the second material; and driving the first evaporation chamber and the second evaporation chamber to move from a first position to a second position along the second direction, wherein the substrate to be evaporated has a preset center along the second direction, at the first position, a first angle between a line connecting the first opening to the preset center and an imaginary connecting line extending from the preset center along the first direction and perpendicular to the substrate to be evaporated is greater than a second angle between a line connecting the second opening to the preset center and the imaginary connecting line, and at the second position, the first angle is smaller than the second angle.

16. The evaporation method according to claim 15, further comprising:

driving the first evaporation chamber and the second evaporation chamber to move from the second position to the first position; wherein at the first position, a distance between the first opening and the substrate to be evaporated is greater than a distance between the second opening and the substrate to be evaporated, and at the second position, a distance between the first opening and the substrate to be evaporated is less than a distance between the second opening and the substrate to be evaporated.

17. An evaporation method for the display panel according to claim 1, comprising:

disposing a substrate to be evaporated on a bearing platform;

disposing a first material in a first evaporation chamber, and disposing a second material in a second evaporation chamber, the first evaporation chamber and the second evaporation chamber being spaced from the bearing platform along a first direction, a first opening of the first evaporation chamber and a second opening of the second evaporation chamber both facing the substrate to be evaporated, and an energy level of the first material being greater than an energy level of the second material; and driving the first evaporation chamber and the second evaporation chamber to move from a third position to a fourth position along a second direction, wherein a first evaporation rate of the first evaporation chamber is different than a second evaporation rate of the second evaporation chamber, a first doped layer and a second doped layer are sequentially formed on the substrate to be evaporated through evaporation, a doping proportion of the first material in the first doped layer is less than a doping proportion of the second material in the first doped layer, a doping proportion of the first material in the second doped layer is greater than a doping proportion of the second material in the second doped layer, and an energy level of the first doped layer is less than an energy level of the second doped layer.

* * * * *